(12) United States Patent
Lee et al.

(10) Patent No.: US 9,419,196 B2
(45) Date of Patent: Aug. 16, 2016

(54) OXIDE NANOPARTICLE-DISPERSED, CHALCOGENIDE-BASED, AND PHASE-SEPARATED COMPOSITE THERMOELECTRIC MATERIAL

(71) Applicant: SK Innovation Co., Ltd., Seoul (KR)

(72) Inventors: Hyeung Jin Lee, Daejeon (KR); Jong Soo Rhyee, Daejeon (KR)

(73) Assignee: SK Innovation Co., Ltd., Seoul (KR)

( * ) Notice: Subject to any disclaimer, the term of this patent is extended or adjusted under 35 U.S.C. 154(b) by 24 days.

(21) Appl. No.: 14/333,984

(22) Filed: Jul. 17, 2014

(65) Prior Publication Data

US 2015/0020862 A1 Jan. 22, 2015

(30) Foreign Application Priority Data

Jul. 18, 2013 (KR) ........................ 10-2013-0084990

(51) Int. Cl.
 *H01L 35/16* (2006.01)
 *H01L 35/22* (2006.01)
 *H01L 35/26* (2006.01)

(52) U.S. Cl.
 CPC ................ *H01L 35/16* (2013.01); *H01L 35/22* (2013.01); *H01L 35/26* (2013.01)

(58) Field of Classification Search
 CPC .................................. H01L 35/16; H01L 35/22
 See application file for complete search history.

(56) References Cited

PUBLICATIONS

Lee et al, "THermoelectric propetries of SrTiO3 nano-particles dispersed indium selenide bulk composite", Applied Physics Letters 102, pp. 2223901-1 to 2223901-4, Jun. 5, 2013.*
Kim et al., "Thermal Conductivity Reduction and Thermoelectric Figure of Merit Increase by Embedding Nanoparticles in Crystalline Semiconductors", Physical Review Letters, Feb. 3, 2006, pp. 1-4, vol. 96, Issue No. 045901, The American Physical Society, US.
Rhyee et al., "Peierls distortion as a route to high thermoelectric performance in In4Se3-δ crystals", Nature Letters, Jun. 18, 2009, pp. 965-968, vol. 459, Macmillan Publishers Limited.
Rhyee et al., "Thermoelectric properties and anisotropic electronic band structure on the In4Se3-x compounds", Applied Physics Letters, Nov. 25, 2009, pp. 1-3, vol. 95, Issue No. 212106, American Institute of Physics, US.
Lee et al., "Enhancement of Thermoelectric Figure of Merit for Bi0.5Sb1.5Te3 by Metal Nanoparticle Decoration", Journal of Electronic Materials, Feb. 10, 2012, pp. 1165-1169, vol. 41, No. 6.
Lee et. al., "Thermoelectric properties of SrTiO3 nano-particles dispersed indium selenide bulk composites", Applied Physics Letters, Jun. 5, 2013, pp. 1-4, vol. 102, Issue No. 223901, AIP Publishing LLC, US.

* cited by examiner

*Primary Examiner* — Carol M Koslow
(74) *Attorney, Agent, or Firm* — The Webb Law Firm (57) ABSTRACT

Provided is a thermoelectric material containing: a matrix containing a Group 13 element of chalcogenide; and oxide nanoparticles dispersed into the matrix to have excellent thermal stability, wherein the oxide nanoparticle forms a coherent interphase interface with the Group 13 element of the chalcogenide-based matrix and is elongated in a specific direction, such that thermal conductivity may be effectively decreased with a trace amount of the oxide nanoparticle to minimize deterioration of electric conductivity.

8 Claims, 10 Drawing Sheets

OXIDE NANOPARTICLE-DISPERSED, CHALCOGENIDE-BASED, AND PHASE-SEPARATED COMPOSITE THERMOELECTRIC MATERIAL

CROSS-REFERENCE TO RELATED APPLICATION

This application claims priority to Korean Patent Application No. 10-2013-0084990 filed Jul. 18, 2013, the disclosure of which is hereby incorporated in its entirety by reference.

TECHNICAL FIELD

The following disclosure relates to a chalcogenide-based and phase-separated composite thermoelectric material, and more specifically, to an oxide nanoparticle-dispersed, chalcogenide-based, and phase-separated composite thermoelectric material.

BACKGROUND

In general, a thermoelectric material is a material capable of being utilized in active cooling, waste heat generation, and the like, using a Peltier effect and a Seebeck effect. The Peltier effect is a phenomenon that when a direct-current (DC) voltage is applied from the outside, holes of a p-type material and electrons of an n-type material are moved to generate heat generation and heat absorption at both ends of the material. The Seebeck effect is a phenomenon that when heat is supplied from an external heat source, the holes and the electrons are moved to generate a current flow in the material, thereby resulting in electricity generation.

It is recognized that the active cooling using the thermoelectric material as described above improves thermal stability of devices, does not generate vibration and noise, and does not use separate condensers and refrigerants to have a small volume and to be environmentally friendly. The active cooling using the thermoelectric material as described above may be used in a refrigerant-free refrigerator, air conditioner, and various micro-cooling systems, and the like, in particular, when a thermoelectric device is attached to various memory devices, as compared to the existing cooling schemes, the thermoelectric device may decrease volume and maintain the device at an uniform and stable temperature, thereby improving performance of the device.

Meanwhile, when the thermoelectric material is utilized for thermoelectric generation by the Seebeck effect, waste heat is capable of being utilized as an energy source to increase efficiency of energy such as waste heat of car engine and exhaust system, waste incinerator and steel mill, power supply of medical device in a human body using a human heat, and the like, or to be capable of being applied in various fields in which the waste heat is collected and used.

As a factor measuring performance of the thermoelectric material as described above, a dimensionless thermoelectric figure of merit (ZT) value is used. In order to increase the ZT value, a material having a high Seebeck coefficient and high electric conductivity, and a low thermal conductivity is required.

It is known that the existing indium selenide thermoelectric material has high ZT value due to a low thermal conductivity and a high Seebeck coefficient (Applied Physics Letters vol. 95, p. 212106, 2009/Nature vol. 459, p. 965, 2009). In addition, as being verified in many thermoelectric materials such as $Bi_2Te_3$, and the like, when nanoparticles are dispersed, a thermal conductivity is decreased due to phonon scattering on an interface of the nanoparticle (J. electronic Materials vol. 41, 1165, 2012/Physical Review Letters vol. 96, 045901, 2006). However, when effective metal nanoparticles are dispersed into $Bi_2Te_3$, and the like, there are problems in that the preparation is not easy due to limitation in a synthetic temperature, there is a limitation in workable temperature thereof due to thermal instability of the nanoparticle, and when the nanoparticles are exposed to heat for a long time, thermal stability of the nanoparticle is rapidly deteriorated to decrease performance.

RELATED ART DOCUMENTS

Non-Patent Documents

Applied Physics Letters vol. 95, p. 212106, 2009.
Nature vol. 459, p. 965, 2009.
J. electronic Materials vol. 41, 1165, 2012.
Physical Review Letters vol. 96, 045901, 2006

SUMMARY

An embodiment of the present invention is directed to providing a Group 13 element of chalcogenide-based thermoelectric material capable of remarkably decreasing thermal conductivity to have an improved thermoelectric physical property and excellent thermal stability.

In one general aspect, a thermoelectric material contains: a matrix containing a Group 13 element of chalcogenide according to the following Chemical Formula 1; and oxide nanoparticles dispersed into the matrix:

$(A_{1-x}A'_x)_{1\pm\delta 1}(B_{1-y}B'_y)_{1\pm\delta 2}$ (Chemical Formula 1)

in the Chemical Formula 1, A is a Group 13 element, A' is an element selected from Group 14, B and B' are different from each other, B is S, Se or Te, B' is an element selected from Group 15 and Group 16, x is a real number satisfying $0 \le x < 0.5$, y is a real number satisfying $0 \le y < 0.5$, and $\delta 1$ and $\delta 2$ are each independently real numbers satisfying $0 \le \delta < 0.1$.

In the matrix, a second phase according to the following Chemical Formula 2 may be phase-separated and dispersed into the Group 13 element of chalcogenide:

$A_{4-x}B_{3-y}$ (Chemical Formula 2)

in the Chemical Formula 2, A is a Group 13 element, B is S, Se or Te, x is a real number satisfying $0 \le x < 0.5$ and y is a real number satisfying $0 \le y < 0.5$.

The oxide nanoparticle may be an oxide having a perovskite structure.

The oxide nanoparticle may have an average diameter of 10 to 50 nm.

The oxide nanoparticle and the matrix may have a coherent interphase interface therebetween and the oxide nanoparticle may be elongated in a surface direction of the coherent interphase interface.

The oxide having a perovskite structure may satisfy the following Chemical Formula 3:

$L_{1-a}L'_aMO_3$ (Chemical Formula 3)

in the Chemical Formula 3, L and L' are different from each other, L is Ba, Sr or La, L' is Ba, Sr, La or Ca, M is Ti, Ru or Mn, and a is a real number satisfying $0 \le a < 0.5$.

The thermoelectric material may contain 1 to 10 parts by weight of the oxide nanoparticles based on 100 parts by weight of the matrix.

A and B of the Chemical Formulas 1 and 2 may be the same as each other, A may be at least one element selected from Al, Ga, In and Tl, A' of the Chemical Formula 1 may be at least one element selected from Si, Ge, Sn and Pb, and B' of the Chemical Formula 1 may be at least one element selected from N, P, As, Sb, Bi, O, S, Se, Te and Po.

DETAILED DESCRIPTION OF EMBODIMENTS

Hereinafter, a thermoelectric material of the present invention will be described in detail with reference to the accompanying drawings. The drawings to be provided below are provided by way of example so that the idea according to the present invention can be sufficiently transferred to those skilled in the art to which the present invention pertains. Therefore, the present invention is not limited to the presented drawings below, and may be embodied in other forms. Also, the drawings presented below may be shown exaggerated in order to clarify the idea according to the present invention. Like reference numerals designate like components in the drawings of the present invention.

Technical terms and scientific terms used in the present specification have the general meaning understood by those skilled in the art to which the present invention pertains unless otherwise defined, and a description for the known function and configuration obscuring the present invention will be omitted in the following description and the accompanying drawings.

The thermoelectric material according to the present invention contains: a matrix containing a Group 13 element of chalcogenide according to the following Chemical Formula 1; and oxide nanoparticles dispersed into the matrix:

(Chemical Formula 1)

in the Chemical Formula 1, A is a Group 13 element, A' is an element selected from Group 14, B and B' are different from each other, B is S, Se or Te, B' is an element selected from Group 15 and Group 16, x is a real number satisfying $0 \leq x < 0.5$, y is a real number satisfying $0 \leq y < 0.5$, and δ1 and δ2 are each independently real numbers satisfying $0 \leq \delta < 0.1$.

In the thermoelectric material according to the present invention, the Group 13 element may include Al, Ga, In and Tl, and A may be at least one element selected from Al, Ga, In and Tl. The Group 14 element may include C, Si, Ge, Sn and Pb, and A' may be at least one element selected from C, Si, Ge, Sn and Pb. The Group 15 may include N, P, As, Sb and Bi, the Group 16 may include O, S, Se, Te and Po, and B' may be at least one element selected from N, P, As, Sb, Bi, O, S, Se, Te and Po, and different from B. In detail, in order to have more excellent thermoelectric property, A may be In or Ga, A' may be at least one element selected from Sn and Pb, B may be Se or Te, B' may be different from B and at least one selected from As, Sb, Bi, S, Se and Te, and x and y may be real numbers satisfying $0 \leq x < 0.5$ and $0 \leq y < 0.5$, respectively.

The Group 13 element of chalcogenide according to the Chemical Formula 1 may have a two-dimensional layered structure, orientation in a certain direction, and low thermal conductivity through an interlayer van der Waals bond.

In the Group 13 element of chalcogenide according to the Chemical Formula 1, thermoelectric figure of merit (ZT) may be further increased by selectively adding a doping component, A' or B', to basic components, A and B to thereby improve an electric conductivity.

The A' and B' components which are doping components may be each independently added as a form of one component system, two component system, or three component system, wherein in a case of the two component system, a relative molar ratio thereof may be 1:9 to 9:1, and in a case of the three component system, a relative molar ratio thereof may be 1:0.1 to 0.9:0.1 to 0.9. However, the present invention is not particularly limited thereto.

The doping elements prevent 2 band conduction in which electrons and holes coexist, such that the electrons or the holes may be mainly conducted to improve a power factor and more deteriorate thermal conductivity.

Each component configuring the Group 13 element of chalcogenide according to the Chemical Formula 1 as described above may be coupled to each other to form a layered structure, wherein in the layered structure, a covalent bond may be formed in an in-plane phase, and an ionic bond and/or a van der Waals bond may be formed between the planes.

In general, a thermal conductivity ($k_{tot}$) is a sum of a thermal conductivity by lattice vibration ($k_{ph}$) and a thermal conductivity by electrons ($k_{el}$), wherein since the electron thermal conductivity is proportional to an electric conductivity (φ) and a temperature (T) by Wiedemann-Frantz (W-F) principle, the electron thermal conductivity is a dependent variable of an electric conductivity. Therefore, an excellent thermoelectric material needs to have a low lattice thermal conductivity, which may be obtained by controlling a lattice structure.

When a (B+B') component is not sufficient in the Group 13 element of chalcogenide according to the Chemical Formula 1, current density may be increased, and the increased current density may distort a lattice due to an interaction with peripheral elements to decrease a thermal conductivity. The lattice distortion occurs due to strong interaction between the electrons and the lattice vibration and may decrease a thermal conductivity.

In the Group 13 element of chalcogenide according to the Chemical Formula 1, each layer in an in-plane direction forms a strong bond by the covalent bond in a state in which the lattice distortion is present, and between the planes, that is, in an out-of-plane direction, the ionic bond or the van der Waals bond, that is, a weak bond may be formed, such that it is difficult to deliver phonon in the out-of-plane direction, and the lattice distortion occurs in the in-plane direction, and thus, thermal conductivity is decreased in both of the in-plane direction and the out-of-plane direction. For example, it is possible that the Group 13 element of chalcogenide according to the Chemical Formula 1 shows 2 W/mK or less of thermal conductivity at room temperature.

In addition, since the Group 13 element of chalcogenide according to the Chemical Formula 1 has a property that a (A+A') component, for example, In is one-dimensionally arranged, a low dimensional conduction property is shown due to the property to improve a Seebeck coefficient property.

In general, it is known that the low dimensional conduction property increases an energy state density at Fermi level, and when energy state density has a sharp singular point, the Seebeck coefficient is increased as shown in the following Equation 1:

$$S = \frac{d^2 \ln(\epsilon)}{dk^2}\bigg|_{\epsilon=\epsilon_F} \quad \text{(Equation 1)}$$

in the Equation 1, S is a Seebeck coefficient, E is an energy state density, ∈F is a Fermi energy and k is a determined movement amount.

It may be appreciated that the Group 13 element of chalcogenide according to the Chemical Formula 1 has the low dimensional electric property in the lattice structure, such that the energy state density is increased at Fermi level, and high Seebeck coefficient is provided in the increased energy state density.

Therefore, the Group 13 element of chalcogenide according to the Chemical Formula 1 may have a low thermal conductivity, and a high Seebeck coefficient due to the low dimensional conduction property of the electrons.

In the thermoelectric material according to the present invention, oxide nanoparticles are dispersed into the matrix containing the Group 13 element of chalcogenide according to the Chemical Formula 1 having the high Seebeck coefficient, such that due to phonon scattering at the interface with the nanoparticles, the thermal conductivity is decreased, such that a higher Seebeck coefficient is provided, and thermal stability of the nanoparticles dispersed into the matrix may be secured, and even though the thermoelectric material is exposed at a high temperature for a long time, deterioration of the properties of the thermoelectric material may be prevented.

The matrix may contain a second phase according to the following Chemical Formula 2 together with the above-described Group 13 element of chalcogenide according to the Chemical Formula 1. In detail, in the matrix, the second phase according to the following Chemical Formula 2 may be phase-separated and dispersed into the Group 13 element of chalcogenide according to the Chemical Formula 1:

$$A_{4-x}B_{3-y} \quad \text{(Chemical Formula 2)}$$

in the Chemical Formula 2, A is a Group 13 element, B is S, Se or Te, x is a real number satisfying 0≤x<0.5 and y is a real number satisfying 0≤y<0.5. The Group 13 element in the Chemical Formula 2 may include Al, Ga, In and Tl, and A in the Chemical Formula 2 may be at least one element selected from Al, Ga, In and Tl. In detail, in the Chemical Formula 2, in order that the matrix has a high Seebeck coefficient, a high electric conductivity and a low thermal conductivity, A may be Ga or In, B may be Se or Te, and y may be a real number satisfying 0≤y<0.5, specifically, 0≤y≤0.1. Here, the second phase according to the Chemical Formula 2 may be formed by phase-separation, such that A of the Chemical Formula 2 may be the same as A of the Chemical Formula 1 and B of the Chemical Formula 2 may be the same as B of the Chemical Formula 1. In detail, in the Chemical Formula 2, in order that the matrix has a high Seebeck coefficient, a high electric conductivity and a low thermal conductivity, A may be Ga or In, B may be Se or Te, and y may be a real number satisfying 0≤y<0.5, specifically, 0≤y≤0.1.

The matrix containing a composite in which the second phase according to the Chemical Formula 2 formed by the phase-separation is dispersed into the Group 13 element of chalcogenide may have low thermal conductivity due to the interface phonon scattering, and due to the oxide nanoparticles dispersed into the matrix and the phonon scattering on the interface of the nanoparticles, the thermal conductivity may be additionally decreased to thereby secure thermal stability and have a high thermoelectric figure of merit (ZT) value.

In the second phase according to the Chemical Formula 2, since the A component is nearly one-dimensionally arranged in the lattice structure, and the electrons and the holes are moved along this route, the Seebeck coefficient may be improved by the low dimensional conduction property.

In addition, in the second phase according to the Chemical Formula 2, when the B component is not sufficient, current density may be increased, and the increased current density may distort a lattice due to an interaction with peripheral elements to decrease the thermal conductivity. The lattice distortion occurs due to strong interaction between the electrons and the lattice vibration and may decrease the thermal conductivity.

As described above, the thermoelectric material according to an exemplary embodiment of the present invention may contain the matrix containing the Group 13 element of chalcogenide satisfying the Chemical Formula 1; and the second phase satisfying the Chemical Formula 2; and oxide nanoparticles dispersed into the matrix.

In detail, the thermoelectric material according to an exemplary embodiment of the present invention may contain the matrix containing the Group 13 element of chalcogenide satisfying the Chemical Formula 1; and the second phase phase-separated and dispersed into the Group 13 element of chalcogenide and satisfying the Chemical Formula 2; and oxide nanoparticles dispersed into the matrix.

In the thermoelectric material according to an exemplary embodiment of the present invention, the matrix may include polycrystalline consisting of crystal grains of the Group 13 element of chalcogenide satisfying the Chemical Formula 1 and the second phase may be distributed in a crystal and/or a grain boundary of the crystal grains of the Group 13 element of chalcogenide. Here, the second phase distributed in the crystal may at least form a coherent interphase interface or a non-coherent interphase interface with the Group 13 element of chalcogenide. Here, on the interface between the second phase and the Group 13 element of chalcogenide, the phonon scattering occurs between the interfaces to deteriorate thermal conductivity.

In the thermoelectric material according to an exemplary embodiment of the present invention, the matrix may contain 5 to 30 wt % of the second phase.

In the thermoelectric material according to an exemplary embodiment of the present invention, the oxide nanoparticle may be an oxide having a perovskite structure. When the oxide having a perovskite structure is distributed in the matrix containing the Group 13 element of chalcogenide according to the Chemical Formula 1, in particular, the Group 13 element of chalcogenide according to the Chemical Formula 1 in which the second phase is dispersed as described above, thermal conductivity may be more effectively decreased, and thus, the Seebeck coefficient may be largely improved.

Specifically, the oxide having a perovskite structure may satisfy the following Chemical Formula 3:

$$L_{1-a}L'_aMO_3 \quad \text{(Chemical Formula 3)}$$

in the Chemical Formula 3, L and L' are different from each other, L is Ba, Sr or La, L' is Ba, Sr, La or Ca, M is Ti, Zr or Mn, and a is a real number satisfying $0 \leq a < 0.5$.

Preferably, the oxide having a perovskite structure may be at least one selected from $BaTiO_3$, $SrTiO_3$ and $Ba_{1-a}Sr_aTiO_3$ (a real number satisfying $0<a<0.5$). The oxide selected from $BaTiO_3$, $SrTiO_3$ and $Ba_{1-a}Sr_aTiO_3$ (a real number satisfying $0<a<0.5$) forms the coherent interphase interface with the above-described matrix and scatters the phonon on the interface between the oxide particles and the matrix, thereby more effectively decreasing the thermal conductivity. In more detail, at least one oxide selected from $BaTiO_3$, $SrTiO_3$ and $Ba_{1-a}Sr_aTiO_3$ (a real number satisfying $0<a<0.5$) may form the coherent interphase interface with both of the Group 13 element of chalcogenide satisfying the Chemical Formula 1 and the second phase, and thus, may more effectively induce the phonon scattering.

The oxide particle having a perovskite structure may have an average diameter of 50 nm or less, substantially, 10 nm to 50 nm, wherein the oxide particle having a perovskite structure does not have a spherical shape, the average diameter may indicate an average diameter when the oxide particle having a perovskite structure is converted into a sphere having the same volume. It is favorable to decrease the average diameter of the oxide particle having a perovskite structure; however, mass production of the oxide nanoparticles having 10 nm or less may extremely increase the production cost, and at the time of preparing the thermoelectric material, undesirable aggregation of the oxide nanoparticles may be formed. When the average diameter thereof is more than 50 nm, an electron scattering is also increased together with the phonon scattering and the electric conductivity becomes decreased, such that the power factor may be reduced.

In the thermoelectric material according to an exemplary embodiment of the present invention, the oxide nanoparticle and the matrix may have a coherent interphase interface therebetween and the oxide nanoparticle may be elongated in a surface direction (a direction appertaining to the interface) of the coherent interphase interface. The elongated oxide nanoparticle may have an aspect ratio (a length of a long axis/a length of a short axis) of 5 to 30, more specifically, 10 to 20.

Specifically, the oxide nanoparticle may be at least one selected from $BaTiO_3$, $SrTiO_3$ and $Ba_{1-a}Sr_aTiO_3$ (a real number satisfying $0 \leq a < 0.5$) and when the average diameter thereof is 10 to 50 nm, the thermal conductivity may be decreased by 30% or more as compared to the thermal conductivity of the matrix into which the second phase is dispersed. That is, the thermal conductivity thereof may correspond to 38% or less of a thermal conductivity of a reference material having the same material and structure as the present invention expect for the oxide particles.

In addition, by the elongated oxide nanoparticle, a smaller amount of the oxide nanoparticle may decrease larger thermal conductivity, thereby minimizing decrease in the electric conductivity of the thermoelectric material by the insulation property of the oxide nanoparticle.

In detail, in the thermoelectric material according to an exemplary embodiment of the present invention, the thermoelectric material may contain 1 to 10 parts by weight of the oxide nanoparticles based on 100 parts by weight of the matrix, and may contain 1 to 6 parts by weight of the oxide nanoparticles which are extremely trace amount based on 100 parts by weight of the matrix by the above-described elongated oxide nanoparticle.

As described above, in the thermoelectric material according to an exemplary embodiment of the present invention, the second phase by the phase-separation and the phonon scattering by the trace amount of the oxide nanoparticle may be effectively generated to minimize deterioration of the electric conductivity and remarkably decrease the thermal conductivity, such that at 600K, 2.8 times or more of the thermoelectric figure of merit (ZT) may be provided based on the thermoelectric figure of merit (ZT) of the matrix into which the second phase is dispersed.

The thermoelectric material according to an exemplary embodiment of the present invention may be a material in which the oxide nanoparticles are dispersed into the polycrystalline matrix, and may have a bulk form. Specifically, the thermoelectric material may be a bulk having various shapes such as rectangular parallelepiped, regular hexahedral, cylindrical, polygonal rod shapes which are appropriate according to usage thereof. In addition, the thermoelectric material according to an exemplary embodiment of the present invention may have more complicated shapes by powderization and pressure-molding depending on usages thereof. In addition, the thermoelectric material according to an exemplary embodiment of the present invention may be a powder.

Further, the thermoelectric material according to an exemplary embodiment of the present invention may be prepared in a thin film shape by general methods such as powderization of the thermoelectric material, application of a solution containing the powderized thermoelectric material, heat treatment of an applied film, and the like, and may be prepared as one-dimensional nanostructure containing one-dimensional nanowire and/or nanotube using templates such as a porous template, and the like.

The thermoelectric material according to an exemplary embodiment of the present invention may have a density of 70 to 100%, specifically, 95 to 100%, based on a theoretical density of a compound according to the Chemical Formula 1. Due to the high density, the thermoelectric material according to an exemplary embodiment of the present invention may have excellent electric conductivity, and may maintain more stable thermal and electric properties.

The thermoelectric material according to an exemplary embodiment of the present invention may be a p-type thermoelectric device or an n-type thermoelectric device.

Hereinafter, a method of preparing a thermoelectric material according to an exemplary embodiment of the present invention will be described. The matrix and/or the thermoelectric material may be prepared by all generally known methods preparing a crystalline chalcogenide.

As a specific and non-limited example thereof, the thermoelectric material or the matrix into which the second phase is dispersed may be prepared using a method of using an ampoule, solid state reaction, an arc melting method, a vapor transfer method, and the like.

In detail, the method of using the ampoule may include a method of putting raw material elements into a quartz tube or an ampoule made of metal, vacuum sealing the quartz tube or the ampoule, and performing a heat treatment.

In detail, the solid state reaction may include a method of mixing raw material powders, followed by pressure-molding, to thereby prepare a molding body, and heat-treating the molding body or heat-treating a mixture containing the raw material powders. Here, the solid state reaction may include a spark plasma sintering or a hot press sintering, and directional sintering. The directional sintering may include high temperature pressure sintering or extrusion sintering, and may further include annealing for overcoming residual stress remained by pressure applied with directionality.

In detail, the arc melting method may include a method of introducing the raw material elements into a reaction chamber, followed by arc discharge under an inert gas atmosphere, to thereby melt the raw material elements and cooling the melted raw material elements.

In more detail, the vapor transfer method may include a method of introducing the raw material elements into one region of a heat treating furnace, applying heat to the raw material elements to be vaporized, transferring the vaporized raw material elements to a lower temperature region by a carrier gas, preparing the vaporized raw material elements as crystallization and growing the raw material elements.

Here, two or more methods among the above-described methods may be performed at the same time. As a specific example, a polycrystalline matrix ingot into which the second phase is dispersed is prepared by an ampoule, pulverized to be a powder, and the powderized matrix (containing the second phase) and the oxide nanoparticles are mixed and molded, followed by plasma sintering or hot press sintering, or extrusion sintering a mixture of the powderized matrix (containing the second phase) and the oxide nanoparticles to thereby prepare a bulk type thermoelectric material.

In addition, in order to prepare a matrix into which the second phase of the Chemical Formula 2 is dispersed, the weighed raw materials are used at a composition in which the compound according to the Chemical Formula 1 and the second phase according to the Chemical Formula 2 coexist in phase diagram to thereby prepare the matrix. Then, after the prepared matrix was powderized, the matrix powder and the metal oxide particles are mixed with each other, followed by heat treatment, thereby preparing the thermoelectric material.

Figure 1:
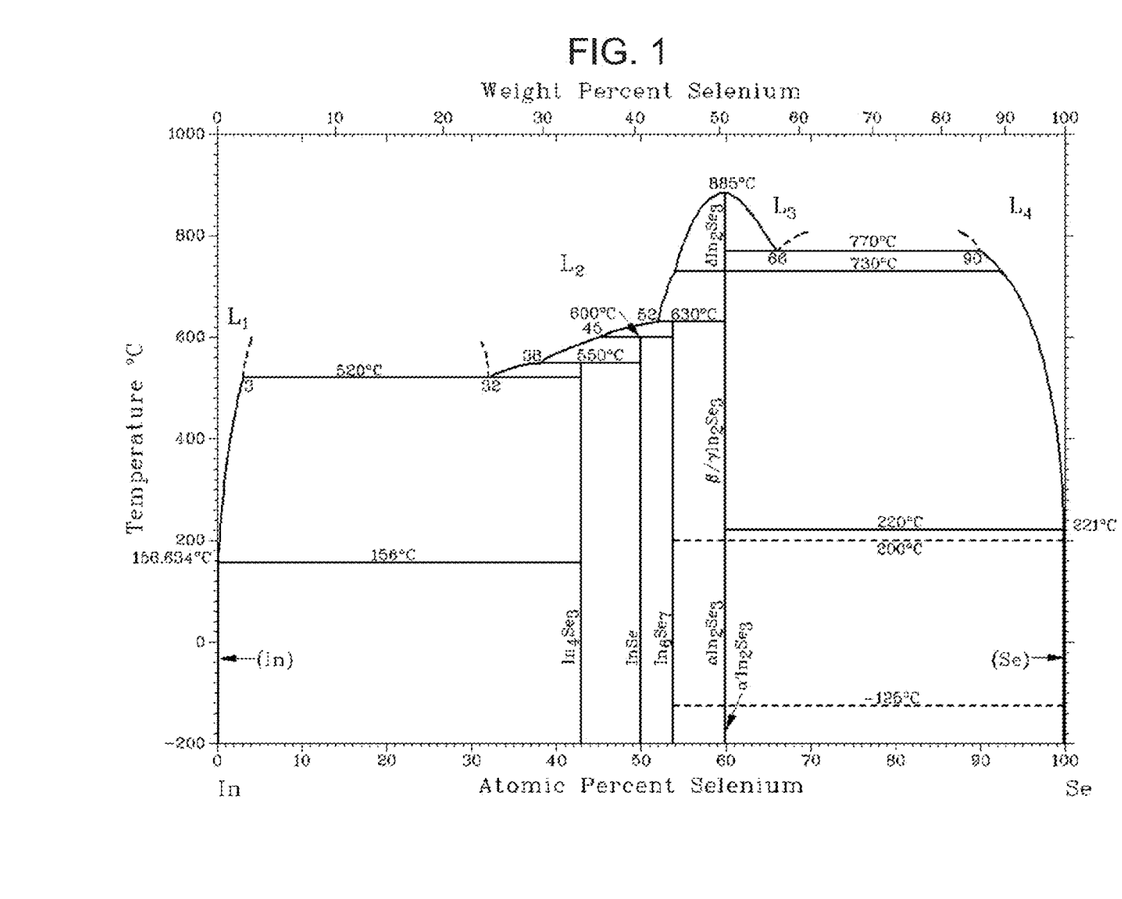
FIG. 1 is a phase diagram of In—Se.

As a specific and non-limited example thereof, when assuming that A is In and B is Se, as shown in FIG. 1 which is a phase diagram of In—Se, InSe and $In_4Se_3$ are adjacent to each other in the phase diagram and present in an eutectic state so that thermodynamic phase-separation is possible, such that In source and Se source are weighed so that In and Se have a molar ratio between In:Se=57:43 and In:Se=50:50, heated up to a temperature (for example, 700° C.) forming an electrolyte phase in the phase diagram to be molten, and then slowly cooled up to a temperature region (for example, 500° C.) in which two phases of InSe and $In_4Se_3$ coexist to induce phase-separation, thereby preparing the InSe ingot (matrix) in which the second phase of $In_4Se_3$ is phase-separated and dispersed. The cooled ingot may be powderized by pulverization. The powderized matrix and the oxide nanoparticles may be mixed by a general wet mixing and a mixed powder obtained by drying a dispersion solvent used in the mixing may be molded to prepare a molded body, followed by heat treatment, thereby preparing the thermoelectric material.

However, the method of preparing the thermoelectric material according to the present invention is not limited to the above-described methods, and the matrix and/or the thermoelectric material may be prepared by all generally known methods preparing the crystalline chalcogenide.

Hereinafter, the present invention will be specifically described based on Example; however, the Example is merely provided in order to experimentally prove that the present invention is excellent, and the present invention is not limited by the Example.

Example

In and Se were weighed at a molar ratio of 57:43, the elements were added to a quartz tube, and the quartz tube was vacuum sealed. Then, the vacuum sealed quartz tube was heat-treated at 590° C. for 24 hours, followed by rapid cooling in flowing water, to thereby prepare an ingot.

Next, the prepared ingot was powderized by agate mortar, 5.263 g of $SrTiO_3$ powder (average size of 20 nm) based on 100 g of the prepared powder (matrix powder) was put thereinto, followed by wet-agitation using normal-hexane and performing a drying process, thereby preparing a mixed powder.

The prepared mixed powder was added to a carbon mold and the spark plasma sintering was performed at a temperature of 350° C. and under a pressure of 70 MPa for 5 minutes, to prepare a sintered body.

The prepared sintered body was vacuum sealed into the quartz tube, followed by heat treatment at 300° C. for 12 hours, to thereby maximize the phase-separation of the second phase.

For measurement of a Seebeck coefficient/an electric conductivity, the prepared sintered body was processed to have a size of a length of 7 to 10 mm and an area of 3×4 mm$^2$, and for measurement of thermal conductivity, the prepared sintered body was processed as a disk having a thickness of 1 mm and a diameter of 10 mm.

As a comparative sample 1, the prepared ingot was powderized, and a sintered body was prepared by the same method as the Example except for mixing $SrTiO_3$ powder therewith, and then the prepared sintered body was processed to have the same size as the Example.

As a comparative sample 2, In and Se were weighed at a molar ratio of 50:50 to prepare an ingot, the prepared ingot was powderized, and a sintered body was prepared by the same method as the Example except for mixing $SrTiO_3$ powder therewith, and then the prepared sintered body was processed to have the same size as the Example.

Hereinafter, in the accompanying drawings, 'STO' means a measurement result of the sample prepared by the Example, '$InSe+In_4Se_3$' means a measurement result of the comparative sample 1, and 'InSe' means a measurement result of the comparative sample 2.

Figure 2:
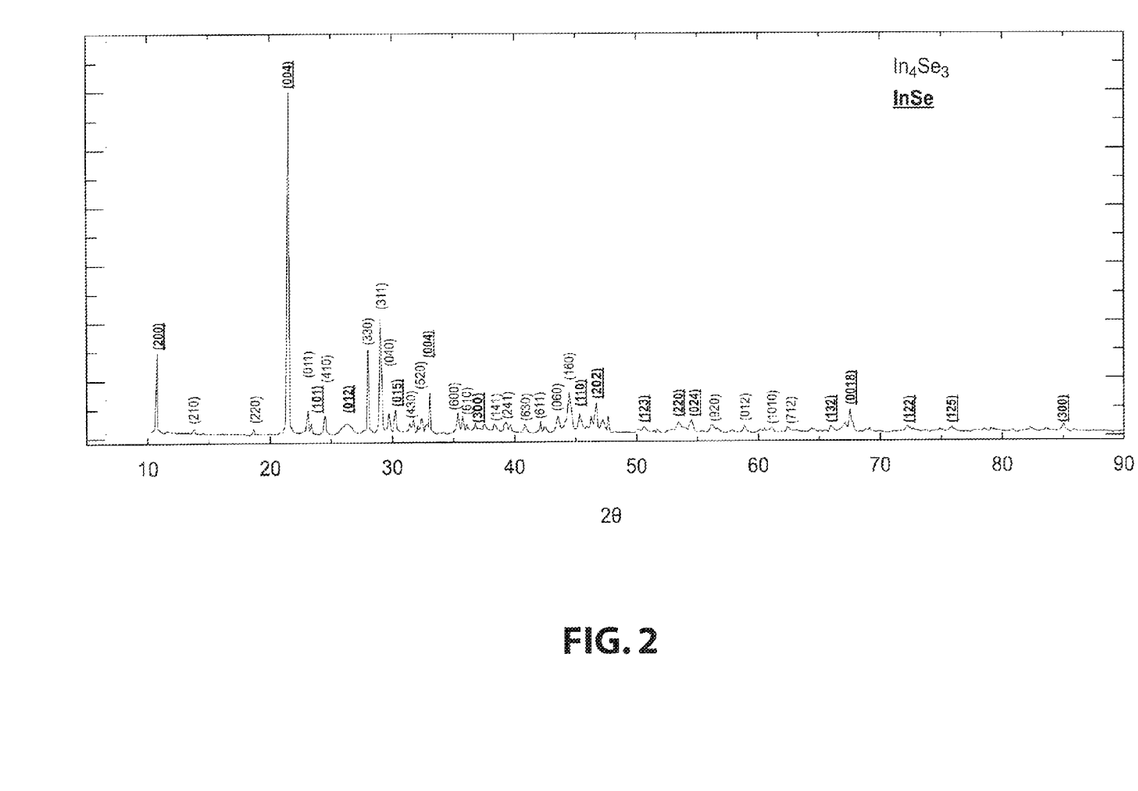
FIG. 2 shows a result of X-ray diffraction of a matrix powder prepared by Example.

FIG. 2 shows a result of X-ray diffraction of the matrix powder prepared by the Example, and it could be appreciated from FIG. 2 that InSe and $In_4Se_3$ were formed.

Figure 3:
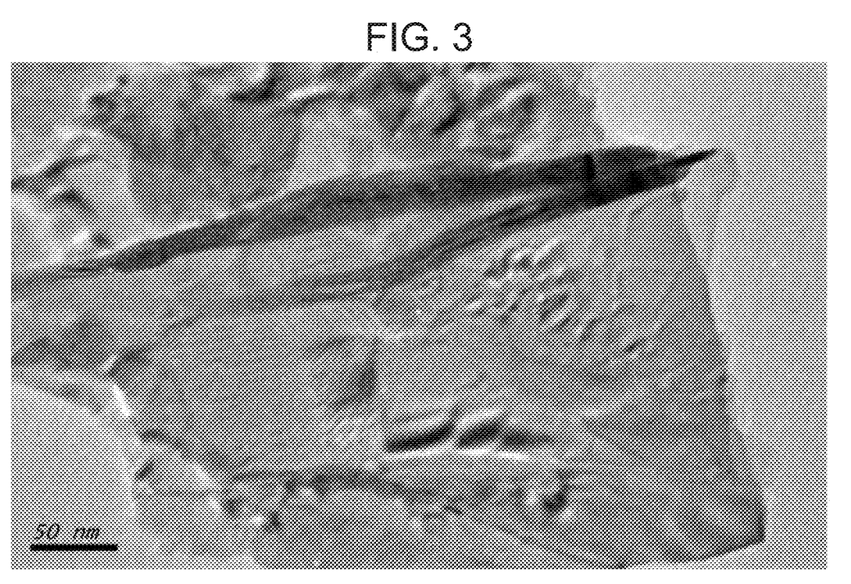
FIG. 3 is a photograph of a sintered body prepared by Example, observed by transmission electron microscope (TEM)

FIG. 3 is a photograph of the spark plasma sintered body prepared by the Example, observed by transmission electron microscope (TEM), and it could be appreciated from FIG. 3 that the initially hexagonal $SrTiO_3$ was elongated so as to be long in one direction, and as a result obtained by observing shapes of a number of $SrTiO_3$ by TEM and SEM, it was confirmed that an average aspect ratio (a length of a long axis/a length of a short axis) is 15.

Figure 4:
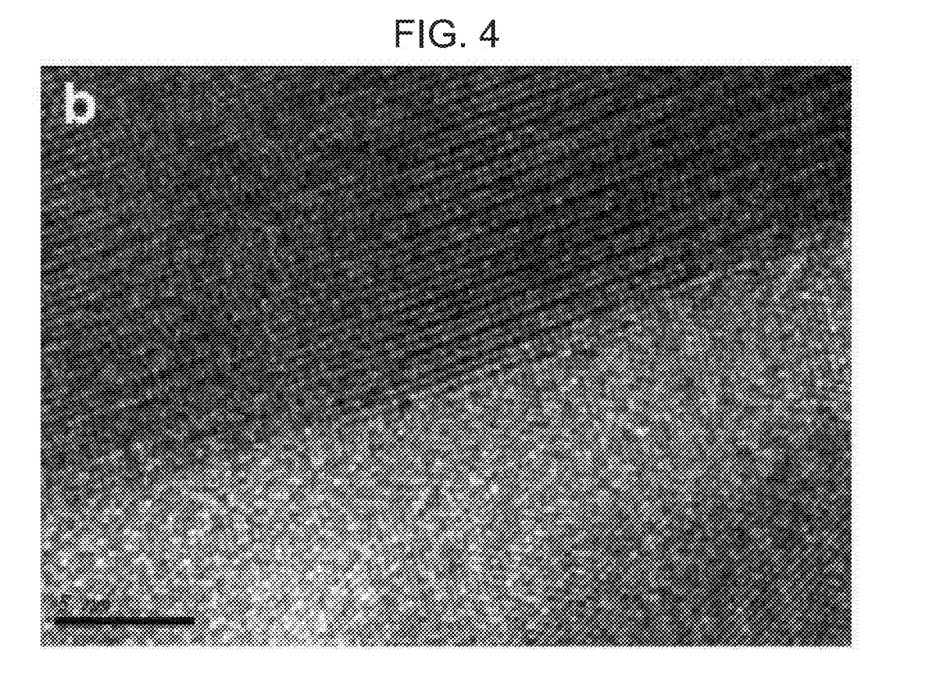
FIG. 4 is a photograph of an interface between the matrix and $SrTiO_3$ in the sintered body prepared by Example, observed by TEM.
Figure 5:
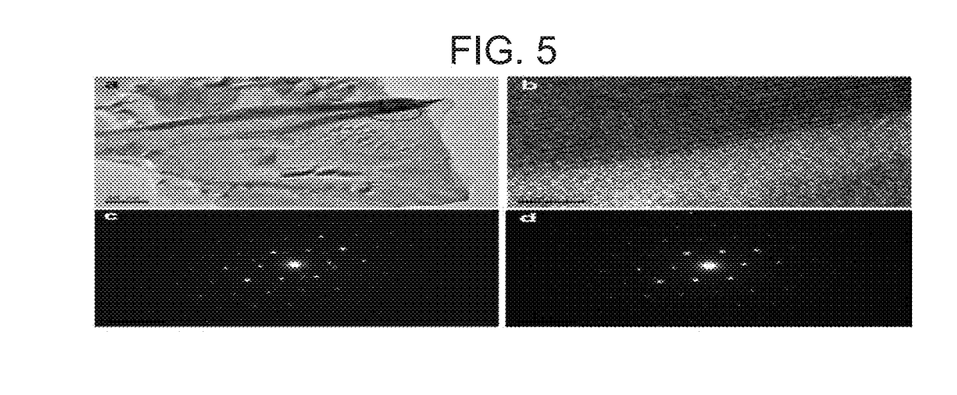
FIG. 5 is a photograph of an electron diffraction pattern on an interface between the matrix and $SrTiO_3$ in the sintered body prepared by Example, observed by TEM.

FIG. 4 is a photograph of an interface between the matrix and $SrTiO_3$ of the sintered body prepared by the Example, observed by TEM and FIG. 5 is a result obtained by observing an electron diffraction plane of $SrTiO_3$ (left side) and $In_4Se_3$ (right side). It could be appreciated from FIG. 4 that the coherent interphase interface was formed between $In_4Se_3$ and $SrTiO_3$.

As an analysis result of the electron diffraction patterns shown in FIG. 5, it could be appreciated that the ab-plane of $SrTiO_3$ and the ab-plane of the matrix ($In_4Se_3$) formed the coherent interphase interface, and $SrTiO_3$ was elongated in <001> direction of the matrix ($In_4Se_3$).

Figure 6:
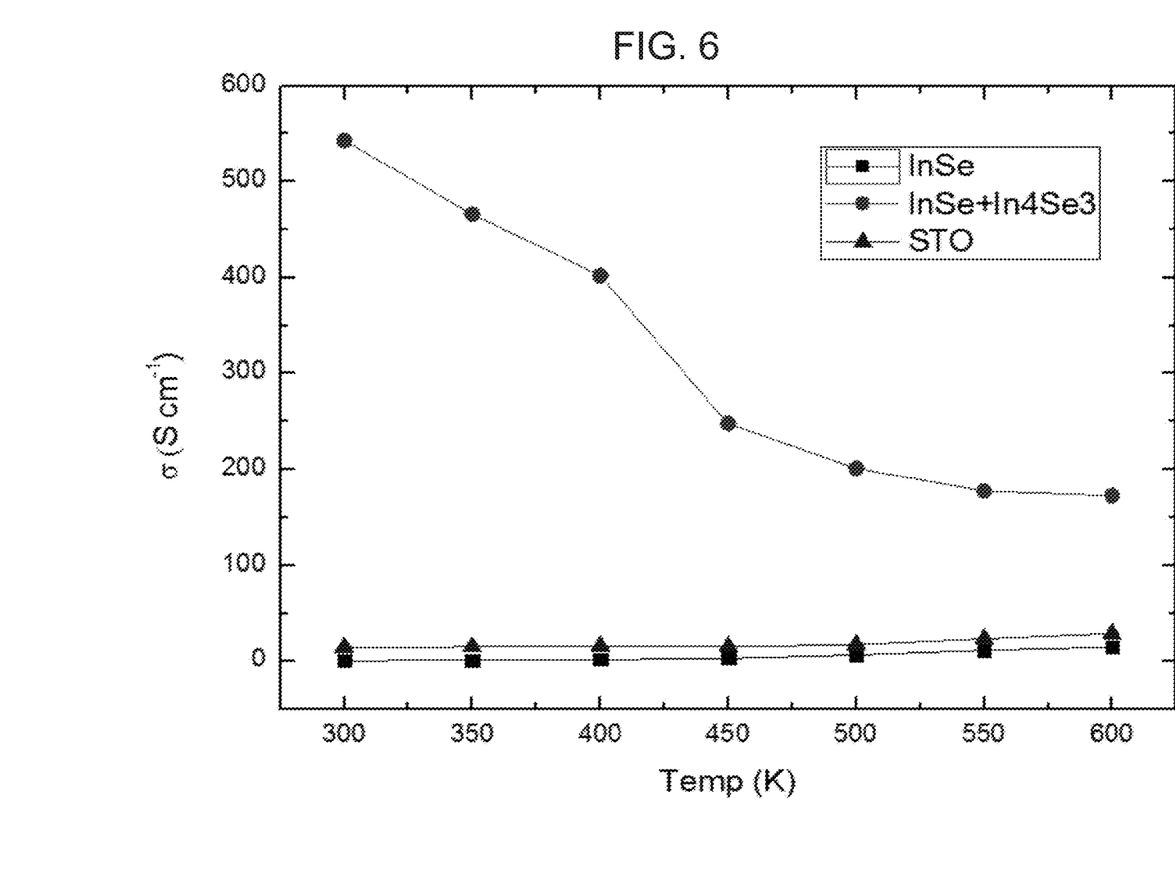
FIG. 6 shows an electric conductivity measured among a thermoelectric material prepared by Example and comparative samples 1 and 2.

FIG. 6 shows an electric conductivity measured among the thermoelectric material ('STO' in FIG. 6) prepared by the Example, the comparative sample 1 ('$InSe+In_4Se_3$' in FIG. 6) and the comparative sample 2 ('InSe' in FIG. 6), and it could be appreciated that in the thermoelectric material prepared by the Example, due to SrTiO$_3$, the electric conductivity was decreased by 80% as compared to the comparative samples.

Figure 7:
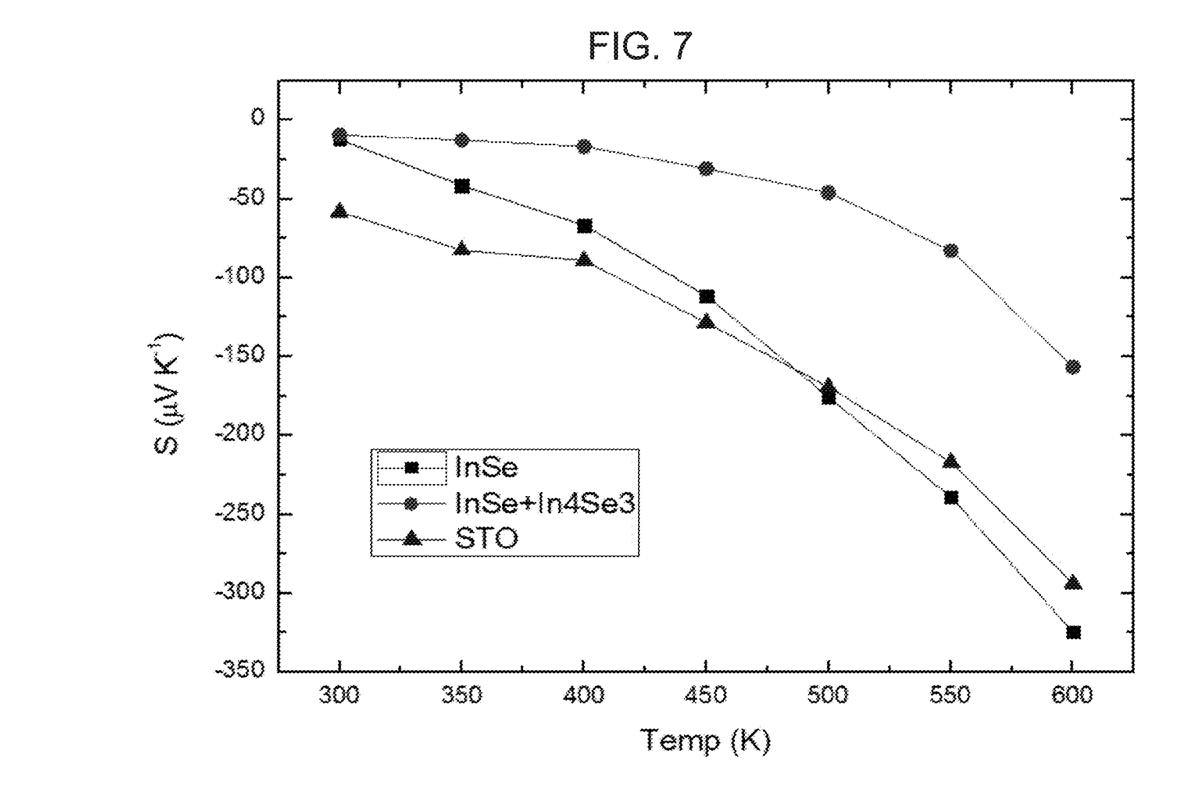
FIG. 7 shows a Seebeck coefficient among the thermoelectric material prepared by Example and the comparative samples 1 and 2.
Figure 8:
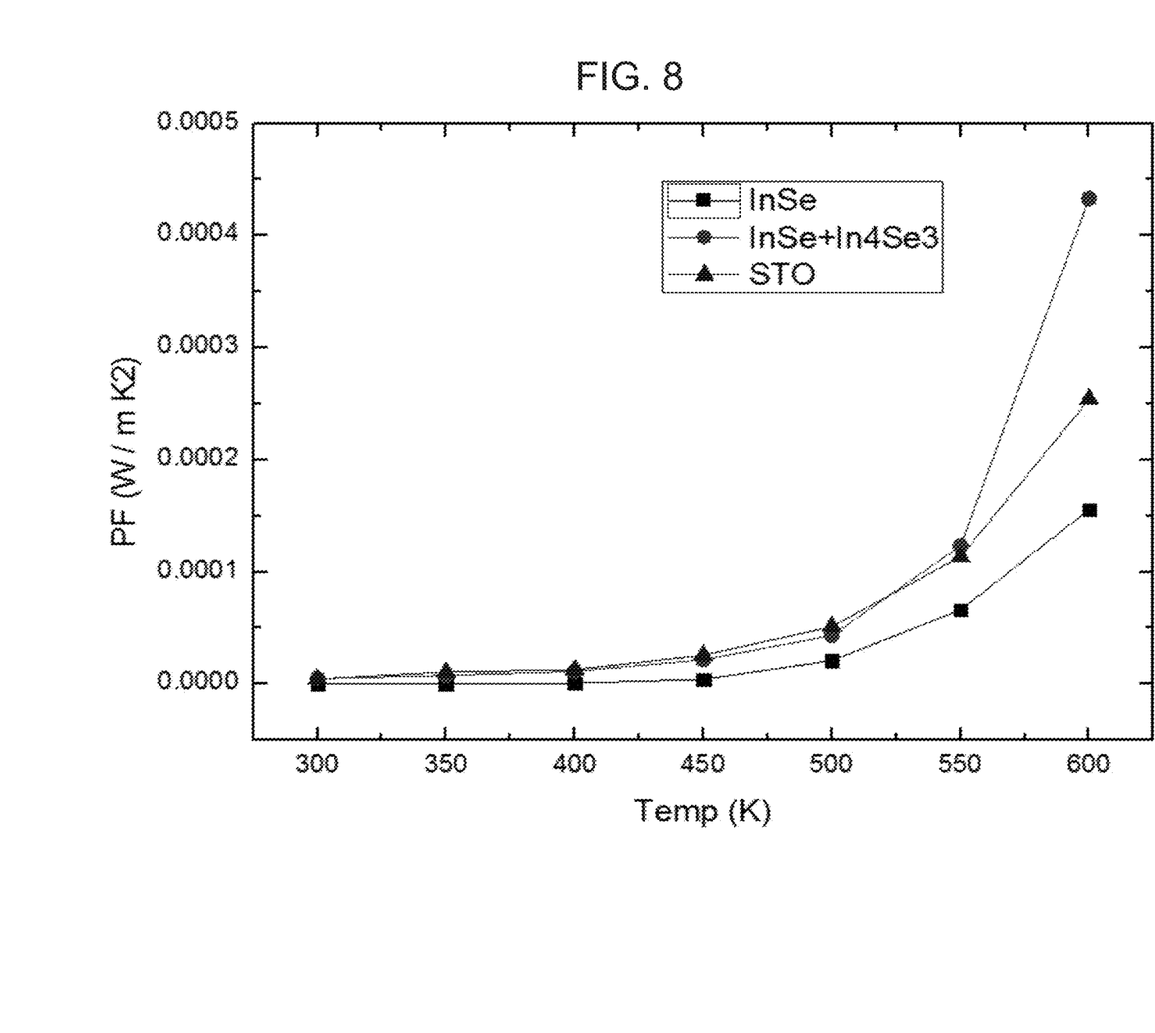
FIG. 8 shows a power factor among the thermoelectric material prepared by Example and the comparative samples 1 and 2.

FIG. 7 shows a Seebeck coefficient among the thermoelectric material prepared by the Example and the comparative samples 1 and 2, and FIG. 8 shows a power factor among the thermoelectric material prepared by the Example and the comparative samples 1 and 2. It could be appreciated that in the thermoelectric material prepared by the Example, due to SrTiO$_3$, the Seebeck coefficient was increased by 50% as compared to the comparative samples, and thus, the power factor was decreased by 50%.

Figure 9:
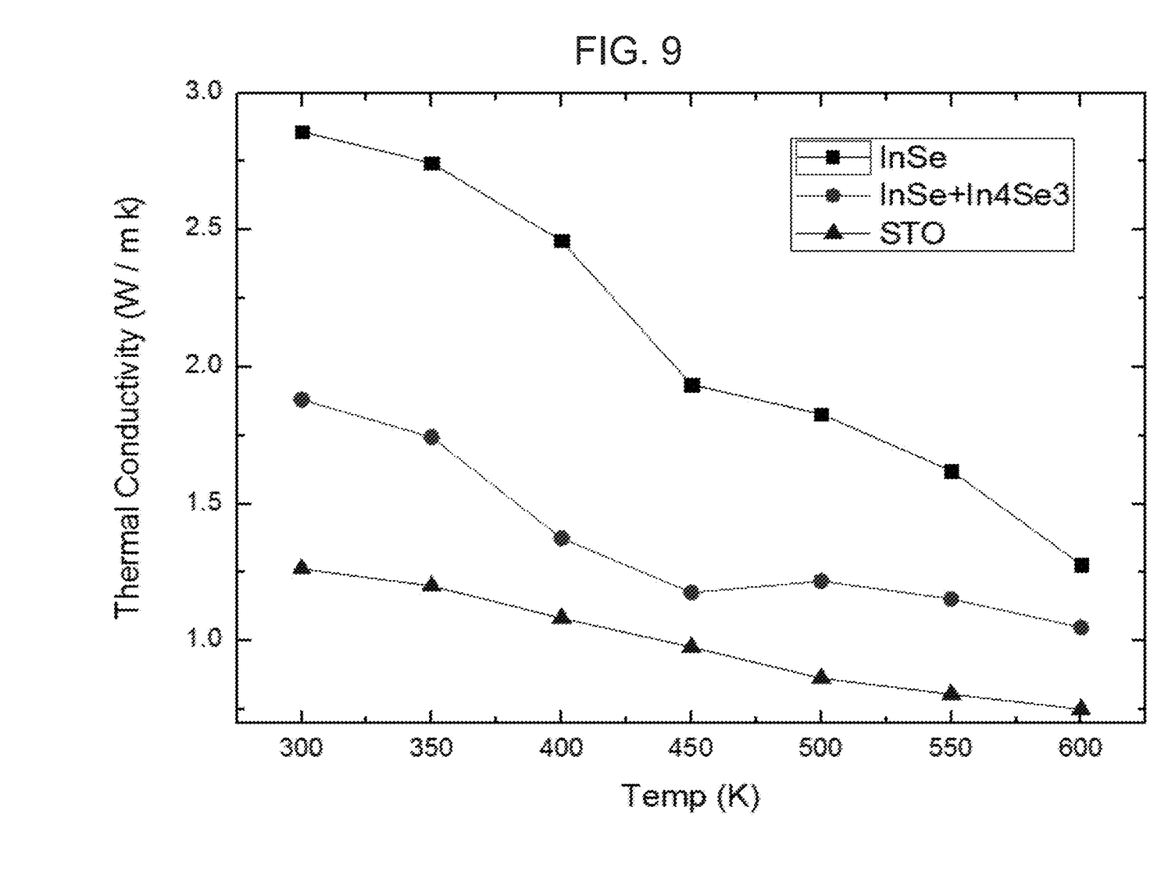
FIG. 9 shows a thermal conductivity measured among the thermoelectric material prepared by Example and comparative samples 1 and 2.
Figure 10:
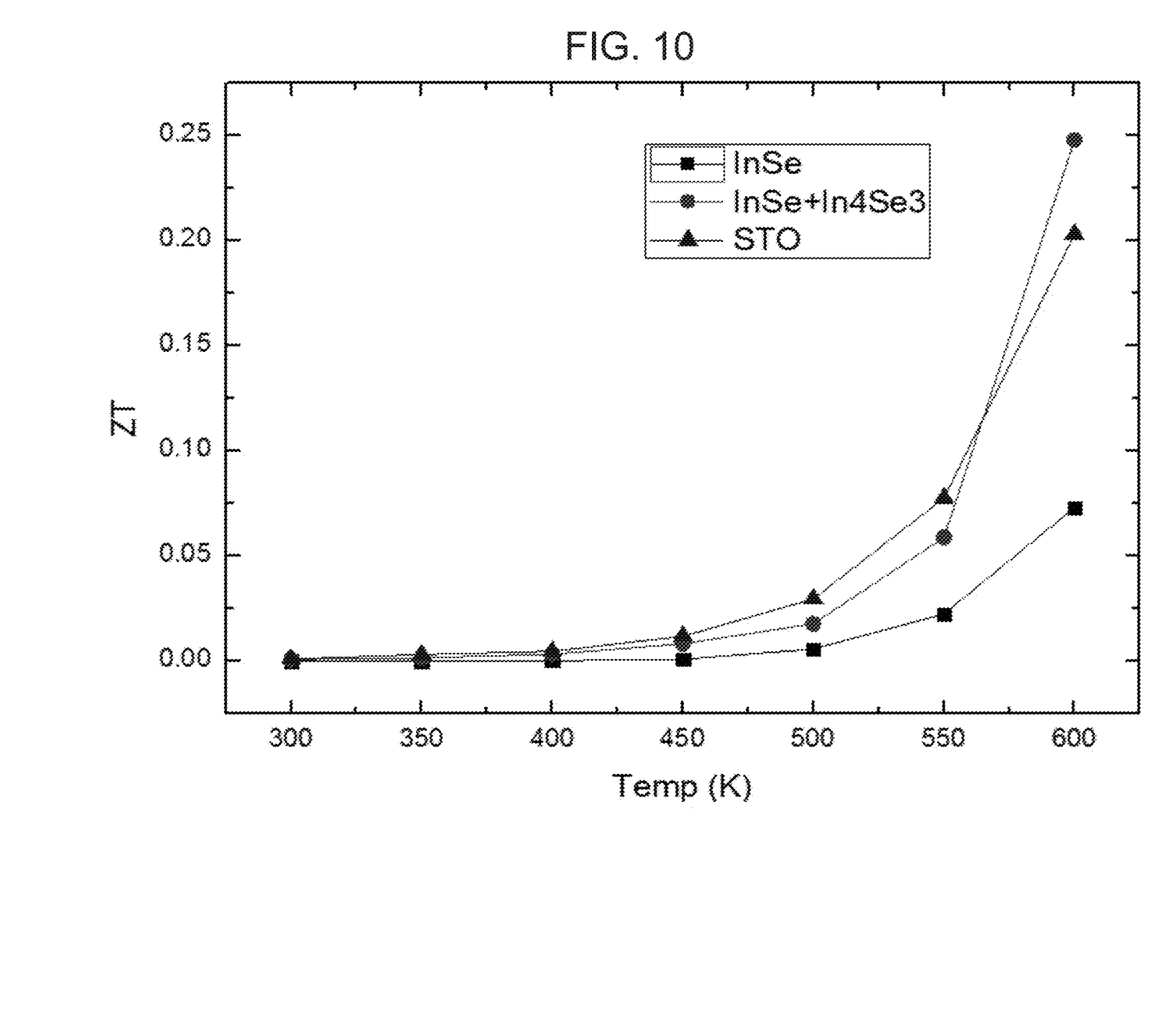
FIG. 10 shows a thermoelectric figure of merit (ZT) value among the thermoelectric material prepared by Example and comparative samples 1 and 2.

FIG. 9 shows a thermal conductivity measured among the thermoelectric material prepared by the Example and the comparative samples 1 and 2; and FIG. 10 shows the thermoelectric figure of merit (ZT) value among the thermoelectric material prepared by the Example and the comparative samples 1 and 2, and it could be appreciated from FIG. 9 that in thermoelectric material prepared by the Example, due to SrTiO$_3$, the thermal conductivity was three times decreased as compared to the comparative samples, such that as shown in FIG. 10, the ZT value was three times increased largely as compared to the comparative samples.

The thermoelectric material of the present invention may induce phonon scattering through the oxide nanoparticles to have excellent thermal stability, the oxide nanoparticle forms a coherent interphase interface with the Group 13 element of the chalcogenide-based matrix and is elongated in a specific direction, such that thermal conductivity may be effectively decreased with a trace amount of the oxide nanoparticle to minimize deterioration of electric conductivity.

Although the exemplary embodiments and drawings defined by specific matters of the present invention have been disclosed for illustrative purposes, the present invention is not limited thereto, and those skilled in the art will appreciate that various modifications, additions and substitutions are possible.

Accordingly, the scope of the present invention is not construed as being limited to the described embodiments but the appended claims as well as equivalent thereof will fall within the scope of the present invention.

What is claimed is:

1. A thermoelectric material comprising:
   a matrix containing a Group 13 element of chalcogenide according to the following Chemical Formula 1; and
   oxide nanoparticles dispersed into the matrix:

$$(A_{1-x}A'x)_{1\pm\delta1}(B_{1-y}B'_y)_{1\pm\delta2} \quad \text{(Chemical Formula 1)}$$

in the Chemical Formula 1, A is at least one of the elements of Group 13, A' is at least one of the elements of Group 14, B and B' are different from each other, B is S, Se or Te, B' is at least one of the elements of Groups 15 and 16, x is a real number satisfying 0≤x<0.5, y is a real number satisfying 0≤y<0.5, and δ1 and δ2 are each independently real numbers satisfying 0≤δ<0.1.

2. The thermoelectric material of claim 1, wherein in the matrix, a second phase according to the following Chemical Formula 2 is phase-separated and dispersed into the Group 13 element of chalcogenide:

$$A_{4-x}B_{3-y} \quad \text{(Chemical Formula 2)}$$

in the Chemical Formula 2, A is at least one of the elements of Group 13, B is S, Se or Te, x is a real number satisfying 0≤x<0.5 and y is a real number satisfying 0≤y<0.5.

3. The thermoelectric material of claim 2, wherein the oxide nanoparticle is an oxide having a perovskite structure.

4. The thermoelectric material of claim 3, wherein the oxide nanoparticle has an average diameter of 10 to 50 nm.

5. The thermoelectric material of claim 4, wherein the oxide nanoparticle and the matrix have a coherent interphase interface therebetween and the oxide nanoparticle is elongated in a surface direction of the coherent interphase interface.

6. The thermoelectric material of claim 3, wherein the oxide having a perovskite structure satisfies the following Chemical Formula 3:

$$L_{1-a}L'_aMO_3 \quad \text{(Chemical Formula 3)}$$

in the Chemical Formula 3, L and L' are different from each other, L is Ba, Sr or La, L' is Ba, Sr, La or Ca, M is Ti, Ru or Mn, and a is a real number satisfying 0≤a<0.5.

7. The thermoelectric material of claim 3, wherein it contains 1 to 10 parts by weight of the oxide nanoparticles based on 100 parts by weight of the matrix.

8. The thermoelectric material of claim 2, wherein A and B of the Chemical Formulas 1 and 2 are the same as each other, A is at least one element selected from Al, Ga, In and Tl, A' of the Chemical Formula 1 is at least one element selected from Si, Ge, Sn and Pb, and B' of the Chemical Formula 1 is at least one element selected from N, P, As, Sb, Bi, O, S, Se, Te and Po.

* * * * *